United States Patent
Cai et al.

(10) Patent No.: US 11,811,414 B1
(45) Date of Patent: Nov. 7, 2023

(54) COMPARATOR CIRCUIT HAVING PRE-CHARGING AND EARLY RESET OUTPUT STAGE

(71) Applicant: JOYWELL SEMICONDUCTOR (SHANGHAI) CO., LTD., Shanghai (CN)

(72) Inventors: Minqing Cai, Shanghai (CN); Yufeng Yao, Shanghai (CN); Yunlong Ge, Shanghai (CN); Haonan Wang, Shanghai (CN); Seung Chul Lee, Shanghai (CN)

(73) Assignee: JOYWELL SEMICONDUCTOR (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 18/245,497

(22) PCT Filed: Aug. 9, 2021

(86) PCT No.: PCT/CN2021/111549
§ 371 (c)(1),
(2) Date: Mar. 15, 2023

(87) PCT Pub. No.: WO2022/057513
PCT Pub. Date: Mar. 24, 2022

(30) Foreign Application Priority Data

Sep. 16, 2020 (CN) .......................... 202010974632.3

(51) Int. Cl.
*H03K 5/24* (2006.01)
(52) U.S. Cl.
CPC .................................... *H03K 5/249* (2013.01)

(58) Field of Classification Search
CPC ............. G01R 19/0038; H03K 5/2418; H03K 5/2445; H03K 5/2481
(Continued)

(56) References Cited

U.S. PATENT DOCUMENTS

2014/0132437 A1 5/2014 Danjo
2019/0277891 A1* 9/2019 Peng .................... H03F 3/45188
(Continued)

FOREIGN PATENT DOCUMENTS

CN 104113292 A 10/2014
CN 105680834 A 6/2016
(Continued)

OTHER PUBLICATIONS

International Search Report (with English translation) and Written Opinion issued in PCT/CN2021/111549, dated Oct. 26, 2021, 8 pages provided.

*Primary Examiner* — Quan Tra
(74) *Attorney, Agent, or Firm* — HAMRE, SCHUMANN, MUELLER & LARSON, P.C.

(57) ABSTRACT

A comparator circuit has a pre-charging and early reset output stage. The comparator circuit includes: a first pre-charging transistor and a second pre-charging transistor. A gate of the first pre-charging transistor is connected to a pre-charging signal, and a gate of the second pre-charging transistor is connected to a main clock signal, wherein the pre-charging signal is enabled earlier than the main clock signal. At a pre-charging phase, there is a small electric current, and a comparator slowly amplifies an input small signal to reduce noise; and the electric current is increased after a certain time delay, such that on the basis of pre-charging, the comparator rapidly completes a pre-amplification phase and then enters a regeneration phase.

10 Claims, 1 Drawing Sheet

(58) Field of Classification Search
USPC .......................................................... 327/65
See application file for complete search history.

(56) References Cited

U.S. PATENT DOCUMENTS

2020/0244256 A1* 7/2020 Jenkins .................. H03K 5/249
2022/0376685 A1* 11/2022 Chen ...................... H03K 3/037

FOREIGN PATENT DOCUMENTS

| CN | 105763192 A | 7/2016 |
| CN | 107888171 A | 4/2018 |
| CN | 111092612 A | 5/2020 |

* cited by examiner

COMPARATOR CIRCUIT HAVING PRE-CHARGING AND EARLY RESET OUTPUT STAGE

TECHNICAL FIELD

The present invention generally relates to the field of integrated circuits, and more particularly to a comparator circuit having pre-charging and early reset output stage.

BACKGROUND

With requirements of process node and communication with large amounts of data, the requirement on analog-to-digital converters is also getting higher and higher. It is necessary to compare very small analog signals and convert them into digital one and zero in a very short time, while for many applications, hysteresis, noise and power consumption performance cannot be sacrificed. Almost all clocked comparators have the following phases: a pre-amplification phase, a regeneration phase, and a reset phase. The function of the pre-amplification phase is to amplify a very small input signal; the function of the regeneration phase is to regenerate the signal of the pre-amplification phase into a digital signal one or zero; the function of the reset phase is to clear the comparator to zero to prepare for a next comparison. StrongArm comparator has the advantages of power consumption and circuit complexity, but the disadvantage is that the current must be increased for the sake of speed, and the current will be increased at the same time in the pre-amplification and regeneration phases, which will cause the pre-amplification phase to reduce its time and increase the noise. On the contrary, if noise reduction is required, a relatively small current and speed is needed to realize it, so that the speed of the regeneration phase is wasted. So there's a trade-off between speed and noise here.

The reset phase of the comparator is to clear the previous comparison to zero and generally needs to be extremely fast to save overall comparator cycles without sacrificing important hysteresis performance. With a long reset time, all internal nodes of the comparator can be reset to zero so that the memory of the previous comparison will be cleared and there will be no hysteresis effect; on the contrary, too short reset time will cause it to be too late to clear to zero. So this is a part of trade-off. In addition, in general, if it is necessary to realize fast clearing to zero, a relatively large MOS transistor is required to pull down to ground, resulting in larger parasitic capacitance and larger initial noise.

SUMMARY OF THE INVENTION

An object of the present invention is to provide a comparator circuit having pre-charging and early reset output stage, which satisfies high speed, low power consumption, and low noise.

The application discloses a comparator circuit having pre-charging and early reset output stage, comprising:
- a first pre-charging transistor and a second pre-charging transistor, wherein the gate of the first pre-charging transistor is connected to a pre-charging signal, the gate of the second pre-charging transistor is connected to a main clock signal, wherein the pre-charging signal is enabled earlier than the main clock signal;
- a first input transistor and a second input transistor, wherein the gate of the first input transistor is connected to a first input signal, the gate of the second input transistor is connected to a second input signal, wherein the source of the first input transistor, the source of the second input transistor, the drain of the first pre-charging transistor and the drain of the second pre-charging transistor are connected together;
- a driving unit connected to the drains of the first input transistor and the drains of the second input transistor respectively, for amplifying a difference between the first input signal and the second input signal;
- an output stage connected to the driving unit at a first node and a second node, respectively, for outputting the amplified signal;
- a first shorting unit connected to the driving unit and configured to short-circuit the driving unit according to the pre-charging signal;
- a second shorting unit connected to the output stage and configured to short-circuit the output stage according to the main clock signal;
- a first inverter, an input terminal of the first inverter being connected to the first node;
- a second inverter, an input terminal of the second inverter being connected to the second node;
- a first reset unit connected to an output terminal of the first inverter and to an inverted main clock signal, for pulling up the voltage of the output terminal of the first inverter; and
- a second reset unit connected to an output terminal of the second inverter and to the inverted main clock signal, for pulling up the voltage of the output terminal of the second inverter.

In a preferred embodiment, the driving unit comprises a first driving PMOS transistor and a second driving PMOS transistor, wherein a source of the first driving PMOS transistor is connected to a drain of the first input transistor, and a source of the second driving PMOS transistor is connected to a drain of the second input transistor.

In a preferred embodiment, the first shorting unit comprises a first shorting NMOS transistor, wherein a source of the first shorting NMOS transistor is connected to the source of the first driving PMOS transistor, a drain of the first shorting NMOS transistor is connected to the source of the second driving PMOS transistor, and a gate of the first shorting NMOS transistor is connected to the pre-charging signal.

In a preferred embodiment, the comparator circuit further comprises a first discharging NMOS transistor and a second discharging NMOS transistor, wherein a gate of the first discharging NMOS transistor is connected to the pre-charging signal, a source of the first discharging NMOS transistor is grounded, and a drain of the first discharging NMOS transistor is connected to the source of the first shorting NMOS transistor and the source of the first driving PMOS transistor; a gate of the second discharging NMOS transistor is connected to the pre-charging signal, a source of the second discharging NMOS transistor is grounded, and a drain of the second discharging NMOS transistor is connected to the drain of the first shorting NMOS transistor and the drain of the first driving PMOS transistor.

In a preferred embodiment, the output stage comprises a first output stage NMOS transistor and a second output stage NMOS transistor, wherein a drain of the first output stage NMOS transistor, the drain of the first driving PMOS transistor, the gate of the second driving PMOS transistor and a gate of the second output stage NMOS transistor are connected together to the first node, a drain of the second output stage NMOS transistor, the drain of the second driving PMOS transistor, the gate of the first driving PMOS transistor and a gate of the first output stage NMOS transistor are connected together to the second node.

In a preferred embodiment, the second shorting unit comprises a second shorting NMOS transistor, wherein a source of the second shorting NMOS transistor is connected to the drain of the first output stage NMOS transistor, a drain of the second shorting NMOS transistor is connected to the drain of the second output stage NMOS transistor, and a gate of the second shorting NMOS transistor is connected to the main clock signal.

In a preferred embodiment, the comparator circuit further comprises a third discharging NMOS transistor and a fourth discharging NMOS transistor, wherein a gate of the third discharging NMOS transistor is connected to the main clock signal, a source of the third discharging NMOS transistor is grounded, and a drain of the third discharging NMOS transistor is connected to the source of the second shorting NMOS transistor and the drain of the first output stage NMOS transistor; a gate of the fourth discharging NMOS transistor is connected to the main clock signal, a source of the fourth discharging NMOS transistor is grounded, and a drain of the fourth discharging NMOS transistor is connected to a drain of the second shorting NMOS transistor and the drain of the second output stage NMOS transistor.

In a preferred embodiment, the first reset unit comprises a first reset transistor, wherein a drain of the first reset transistor is connected to the output terminal of the first inverter, and a gate of the first reset transistor is connected to an inverted main clock signal.

In a preferred embodiment, the second reset unit comprises a second reset transistor, wherein a drain of the second reset transistor is connected to the output terminal of the second inverter, and a gate of the second reset transistor is connected to an inverted main clock signal.

In a preferred embodiment, the first pre-charging transistor and the second pre-charging transistor are PMOS transistors.

Compared with the prior art, the present invention has the following beneficial effects:

In the technical solution of the present invention, in the pre-charging phase, the current is very small, the comparator will slowly amplify the input small signal to reduce the noise, and does not cause additional speed delay. The current is increased after a certain time delay, the comparator will rapidly finish the pre-amplification phase and then enter the regeneration phase on the basis of pre-charging. The regeneration phase can be completed rapidly due to the increased current. Since there is already some signal amplification during the pre-charge period, the noise equivalent to the input is reduced during the subsequent phases. Therefore, the comparator of the present invention can satisfy high speed, low power consumption and low noise at the same time.

Furthermore, the technical solution of the present invention can feed forward to reset the output stage in advance. These measures reduces the hysteresis to the range of indexes without increasing reset time and without increasing internal capacitance too much.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute various new technical solutions (all of which are considered to have been described in this specification), unless a combination of such technical features is not technically feasible. For example, the features A+B+C are disclosed in one example, and features A+B+D+E is disclosed in another example, and features C and D are equivalent technical means serving the same purpose, and technically, only one of them can be used at the same time, and it is impossible to use both of them at the same time, and technically, feature e can be combined with feature C. Therefore, the scheme A+B+C+D should not be regarded as described because it is technically infeasible, and the scheme A+B+C+E should be regarded as described.

BRIEF DESCRIPTION OF THE FIGURES

Non-limiting and non-exhaustive embodiments of the present application are described with reference to the following drawings, where like reference numerals refer to like parts throughout the various views unless otherwise specified.

DETAILED DESCRIPTION

Various aspects and examples of the present application will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Some of the innovations of the present invention are:

The solution of the present invention is to use two phase enable clock signals, wherein one clock signal first turns on a small current to pre-charge, at the pre-charging phase, the current is small, the comparator will slowly amplify the small input signal to reduce noise. Since this time is unavoidable for the low noise comparator, there is no additional speed delay. After a certain amount of time delay, a main clock is turned on to increase the current. At this time, the comparator will quickly complete the pre-amplification phase on the basis of pre-charging and enter the regeneration phase. The regeneration phase can be completed rapidly due to the increased large current. As a result of certain signal amplification during the pre-charging time, equivalent input noise in the subsequent phases is reduced. Therefore, this architecture can satisfy high speed, low power consumption and low noise at the same time.

The solution of the present invention is to reset the comparator with a reset signal when the output stage is also reset in advance. From the actual effect, these measures decreases hysteresis to the range of indexes without increasing reset time and increasing internal capacitance too much.

Figure 1:
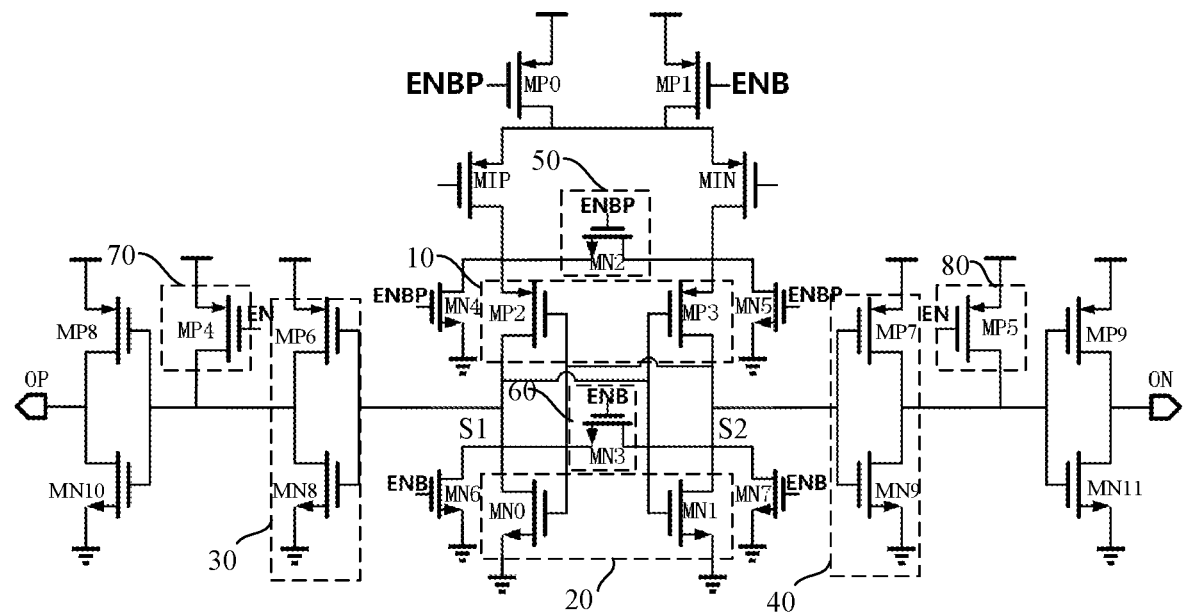
FIG. 1 shows a schematic diagram of a comparator circuit having pre-charging and early reset output stage in accordance with an embodiment of the present invention.

An embodiment of this application provides a comparator circuit having pre-charging and early reset output stage, and FIG. 1 shows a schematic diagram of the comparator circuit having pre-charging and early reset output stage, which includes: a first pre-charging transistor MP0, a second pre-charging transistor MP1, a first input transistor MIP, a second input transistor MIN, a driving unit 10, an output stage 20, a first shorting unit 50, a second shorting unit 60, a first inverter 30, a second inverter 40, a first reset unit 70, and a second reset unit 80.

A gate of the first pre-charging transistor MP0 is connected to a pre-charging signal ENBP, and a gate of the second pre-charging transistor MPT is connected to a main clock signal ENB, wherein the pre-charging signal ENBP is enabled earlier than the main clock signal ENB. In one embodiment, the first pre-charging transistor MP0 and the second pre-charging transistor MPT are PMOS transistors.

A gate of the first input transistor MIP is connected to a first input signal (not shown), a gate of the second input transistor MIN is connected to a second input signal (not shown), and a source of the first input transistor MIP, a source of the second input transistor MIN, a drain of the first pre-charging transistor MP0 and a drain of the second pre-charging transistor MPT are connected together. In one embodiment, the first input transistor MIP and the second input transistor MIN are PMOS transistors.

The driving unit 10 is connected to a drain of the first input transistor MIP and a drain of the second input transistor MIN respectively, and is configured to amplify a difference between the first input signal and the second input signal. The output stage 20 and the driving unit 10 are connected to a first node S1 and a second node S2, and are configured to output the amplified signal.

The first shorting unit 50 is connected to the driving unit 10 and short-circuits the driving unit 10 according to the pre-charging signal ENBP, and the second shorting unit 60 is connected to the output stage 20 and short-circuits the output stage 20 according to the main clock signal ENB.

An input terminal of the first inverter 30 is connected to the first node S1, and an input terminal of the second inverter 40 is connected to the second node S2. The first reset unit 70 includes a first reset transistor MP4, a drain of the first reset transistor MP4 is connected to the output terminal of the first inverter 30, and a gate of the first reset transistor MP4 is connected to an inverted main clock signal EN. The second reset unit 80 comprises: a second reset transistor MP5, a drain of the second reset transistor 80 is connected to the output terminal of the second inverter 40, and a gate of the second reset transistor 80 is connected to the inverted main clock signal EN. In one embodiment, the first reset transistor 70 and the second reset transistor 80 are PMOS transistors.

In the present embodiment, the reset unit adopts a PMOS transistor, but those skilled in the art should understand that in other embodiments of the present invention, the reset unit may also adopt other structures, as long as the output terminal of the inverter can be pulled up, which is also within the scope of the protection concept of the present invention.

In one embodiment, the driving unit 10 comprises: a first driving PMOS transistor MP2 and a second driving PMOS transistor MP3, a source of the first driving PMOS transistor MP2 is connected to the drain of the first input transistor MIP, and a source of the second driving PMOS transistor MP3 is connected to the drain of the second input transistor MIN.

In one embodiment, the first shorting unit 50 comprises: a first shorting NMOS transistor MN2, a source of the first shorting NMOS transistor MN2 is connected to the source of the first driving PMOS transistor MP2, a drain of the first shorting NMOS transistor MN2 is connected to the source of the second driving PMOS transistor MP3, and a gate of the first shorting NMOS transistor MN2 is connected to the pre-charging signal ENBP.

In the present embodiment, the shorting unit adopts an NMOS transistor, but those skilled in the art should understand that in other embodiments of the present invention, the shorting unit may also adopt other structures, as long as the source of the driving transistor can be short-circuited, which is also within the scope of the protection concept of the present invention.

In one embodiment, the comparator circuit further comprises: a first discharging NMOS transistor MN4 and a second discharging NMOS transistor MN5. A gate of the first discharging NMOS transistor MN4 is connected to the pre-charging signal ENBP, a source of the first discharging NMOS transistor MN4 is grounded, and a drain of the first discharging NMOS transistor MN4 is connected together to the source of the first short-circuited NMOS transistor MN2 and the source of the first driving PMOS transistor MP2; a gate of the second discharging NMOS transistor MN5 is connected to the pre-charging signal ENBP, a source of the second discharging NMOS transistor MN5 is grounded, and a drain of the second discharging NMOS transistor MN5 is connected together to the drain of the first short-circuited NMOS transistor MN2 and the drain of the first driving PMOS transistor MP2.

In one embodiment, the output stage 20 comprises: a first output stage NMOS transistor MN0 and a second output stage NMOS transistor MN1. A drain of the first output stage NMOS transistor MN0, a drain of the first driving PMOS transistor MP2, a gate of the second driving PMOS transistor MP3 and a gate of the second output stage NMOS transistor MN1 are connected to the first node S1, a drain of the second output stage NMOS transistor MN1, a drain of the second driving PMOS transistor MP3, a gate of the first driving PMOS transistor MP2 and a gate of the first output stage NMOS transistor MN0 are connected to the second node S2.

In one embodiment, the second shorting unit 60 comprises: a second shorting NMOS transistor MN3, wherein a source of the second shorting NMOS transistor MN3 is connected to the drain of the first output stage NMOS transistor MN0, a drain of the second shorting NMOS transistor MN3 is connected to the drain of the second output stage NMOS transistor MN1, and a gate of the second shorting NMOS transistor MN3 is connected to the main clock signal ENB.

In one embodiment, the comparator circuit further comprises: a third discharging NMOS transistor MN6 and a fourth discharging NMOS transistor MN7, wherein a gate of the third discharging NMOS transistor MN6 is connected to the main clock signal ENB, a source of the third discharging NMOS transistor MN6 is grounded, and a drain of the third discharging NMOS transistor MN6 is connected to the source of the second shorting NMOS transistor MN3 and the drain of the first output stage NMOS transistor MN0; a gate of the fourth discharging NMOS transistor MN7 is connected to the main clock signal ENB, a source of the fourth discharging NMOS transistor MN7 is grounded, and a drain of the fourth discharging NMOS transistor MN7 is connected to a drain of the second shorting NMOS transistor MN3 and a drain of the second output stage NMOS transistor MN1.

In one embodiment, the first inverter 30 includes a PMOS transistor MP6 and an NMOS transistor MN8. In one embodiment, the comparator circuit further includes a third inverter, an input terminal of the third inverter is connected to the output terminal of the first inverter 30, and the output terminal forms the positive output terminal of the comparator. The third inverter includes a PMOS transistor MP8 and an NMOS transistor MN10.

In one embodiment, the second inverter 40 includes a PMOS transistor MP7 and an NMOS transistor MN10. In one embodiment, the comparator circuit further includes a fourth inverter, an input terminal of the fourth inverter is connected to the output terminal of the second inverter 40, and the output terminal forms the negative output terminal of the comparator. The fourth inverter includes a PMOS transistor MP9 and an NMOS transistor MN11.

In the comparator architecture shown in FIG. 1, MP0 and MPT are controlled by the pre-charging signal and the main clock signal, respectively. MN2 and MN3 are shorting MOS transistors to reduce hysteresis and memory effects. MP4 and MP5 are used to implement feed-forward early reset to reduce the memory effect of output coupling to the internal.

Figure 2:
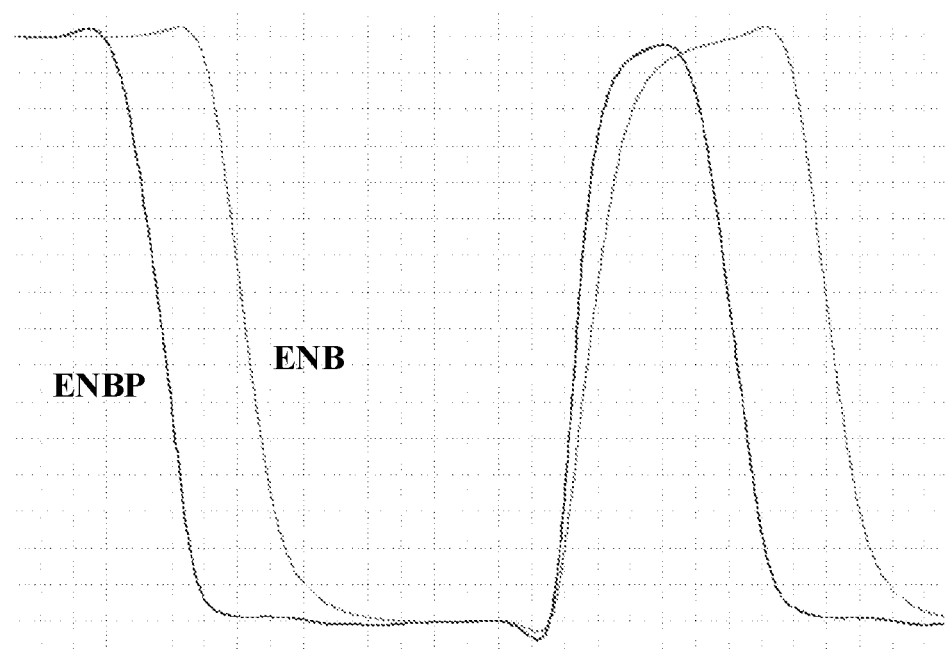
FIG. 2 is a timing diagram illustrating the operation of a comparator circuit having pre-charging and early reset output stage in accordance with an embodiment of the present invention.

FIG. 2 shows a timing diagram of the pre-charging signal ENBP and the main clock signal ENB. The inverted main clock signal EN and the main clock signal ENB are a pair of inverted clock signals, which are not shown in the figure. In the present invention, the pre-charging signal ENBP reaches a low level earlier than the main clock signal ENB, so that the pre-charging transistor MP0 is turned on earlier than MP1, so that the comparator is pre-charged with a small current. In the technical solution of the present invention, at the pre-charging phase, there is a small current, and the comparator slowly amplifies the input small signal to reduce noise, and no additional speed delay is caused.

After a certain amount of time delay, the clock signal ENB reaches a low level, so that the transistor MPT is turned on, thereby increasing the current, so that the comparator will quickly complete the pre-amplification phase on the basis of pre-charging and enter the regeneration phase. The drive transistors MP2, MP3 can complete the regeneration phase rapidly due to the increased current. As a result of certain signal amplification during the pre-charging time, equivalent input noise in the subsequent phases is reduced. Therefore, the comparator circuit of the present invention can satisfy high speed, low power consumption and low noise at the same time.

After a certain amount of time, the pre-charging signal ENBP reaches a high level. At this time, the comparator completes comparison, amplification, and regeneration, and the driving transistor needs to be cleared to zero. At this time, the shorting transistor MN2 is turned on, and the discharging transistors MN4 and MN5 are turned on. The shorting transistor MN2 makes the sources of the driving transistors MP2 and MP3 short-circuited, so that the driving transistors are cleared to zero quickly.

After a certain amount of time, the main clock signal ENB reaches a high level. At this time, the output stage has output the amplified result and needs to be cleared to zero. At this time, the shorting transistor MN3 is turned on, the discharging transistors MN6 and MN7 are turned on, and the shorting transistor MN3 makes the drains of the output stage transistors MN0 and MN1 short-circuited, so that the output stage transistors are cleared to zero quickly. In addition, the inverted main clock signal EN reaches a low level, so that the reset transistors MP4, MP5 are turned on, thereby pulling up the output terminals of the first inverter 30 and the second inverter 40 to a high level. The technical solution of the present invention can feed forward to reset the output stage in advance, these measures decreases hysteresis to the range of indexes without increasing reset time and increasing internal capacitance too much.

It should be noted that the comparator circuit of the present invention can be manufactured by using a semiconductor CMOS process, and the current of the PMOS transistor or the NMOS transistor in the circuit is related to the size of the transistor, the circuit voltage and other factors. For example, at the pre-charging phase, a small circuit current is required, and in this case, the pre-charging transistors MP0, MPT should adopt a smaller transistor size, while in the signal amplification and regeneration phase, a larger circuit current is required, and in this case, the input transistors MIP, MIN and the driving transistors MP2, MP3 should adopt a larger transistor size.

It is noted that throughout the specification, terms of relationship such as first, second, etc. are used only to distinguish one entity or operation from another entity or operation, and do not necessarily require or imply any actual relationship or sequence between such entities or operations. Furthermore, the term "comprises" or "comprising" or "includes" or any other variations thereof is intended to encompass a non-exclusive inclusion, such that a process, method, article, or device that comprises a multiple elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

The invention claimed is:

1. A comparator circuit having pre-charging and early reset output stage, comprising:
a first pre-charging transistor and a second pre-charging transistor, wherein the gate of the first pre-charging transistor is connected to a pre-charging signal, the gate of the second pre-charging transistor is connected to a main clock signal, wherein the pre-charging signal is enabled earlier than the main clock signal;
a first input transistor and a second input transistor, wherein the gate of the first input transistor is connected to a first input signal, the gate of the second input transistor is connected to a second input signal, wherein the source of the first input transistor, the source of the second input transistor, the drain of the first pre-charging transistor and the drain of the second pre-charging transistor are connected together;

a driving unit connected to the drains of the first input transistor and the drains of the second input transistor respectively, for amplifying a difference between the first input signal and the second input signal;

an output stage connected to the driving unit at a first node and a second node, respectively, for outputting the amplified signal;

a first shorting unit connected to the driving unit and configured to short-circuit the driving unit according to the pre-charging signal;

a second shorting unit connected to the output stage and configured to short-circuit the output stage according to the main clock signal;

a first inverter, an input terminal of the first inverter being connected to the first node;

a second inverter, an input terminal of the second inverter being connected to the second node;

a first reset unit connected to an output terminal of the first inverter and to an inverted main clock signal, for pulling up the voltage of the output terminal of the first inverter; and a second reset unit connected to the output terminal of the second inverter and to the inverted main clock signal, for pulling up the voltage of the output terminal of the second inverter.

2. The comparator circuit of claim 1, wherein the driving unit comprises a first driving PMOS transistor and a second driving PMOS transistor, wherein the source of the first driving PMOS transistor is connected to the drain of the first input transistor, and the source of the second driving PMOS transistor is connected to the drain of the second input transistor.

3. The comparator circuit of claim 2, wherein the first shorting unit comprises a first shorting NMOS transistor, wherein the source of the first shorting NMOS transistor is connected to the source of the first driving PMOS transistor, the drain of the first shorting NMOS transistor is connected to the source of the second driving PMOS transistor, and the gate of the first shorting NMOS transistor is connected to the pre-charging signal.

4. The comparator circuit of claim 3, further comprising a first discharging NMOS transistor and a second discharging NMOS transistor, wherein the gate of the first discharging NMOS transistor is connected to the pre-charging signal, the source of the first discharging NMOS transistor is grounded, and the drain of the first discharging NMOS transistor is connected to the source of the first shorting NMOS transistor and the source of the first driving PMOS transistor; the gate of the second discharging NMOS transistor is connected to the pre-charging signal, the source of the second discharging NMOS transistor is grounded, and the drain of the second discharging NMOS transistor is connected to the drain of the first shorting NMOS transistor and the drain of the first driving PMOS transistor.

5. The comparator circuit of claim 2, wherein the output stage comprises a first output stage NMOS transistor and a second output stage NMOS transistor, wherein the drain of the first output stage NMOS transistor, the drain of the first driving PMOS transistor, the gate of the second driving PMOS transistor and the gate of the second output stage NMOS transistor are connected together to the first node, the drain of the second output stage NMOS transistor, the drain of the second driving PMOS transistor, the gate of the first driving PMOS transistor and the gate of the first output stage NMOS transistor are connected together to the second node.

6. The comparator circuit of claim 5, wherein the second shorting unit comprises a second shorting NMOS transistor, wherein the source of the second shorting NMOS transistor is connected to the drain of the first output stage NMOS transistor, the drain of the second shorting NMOS transistor is connected to the drain of the second output stage NMOS transistor, and the gate of the second shorting NMOS transistor is connected to the main clock signal.

7. The comparator circuit of claim 6, further comprising a third discharging NMOS transistor and a fourth discharging NMOS transistor, wherein the gate of the third discharging NMOS transistor is connected to the main clock signal, the source of the third discharging NMOS transistor is grounded, and the drain of the third discharging NMOS transistor is connected to the source of the second shorting NMOS transistor and the drain of the first output stage NMOS transistor; the gate of the fourth discharging NMOS transistor is connected to the main clock signal, the source of the fourth discharging NMOS transistor is grounded, and the drain of the fourth discharging NMOS transistor is connected to the drain of the second shorting NMOS transistor and the drain of the second output stage NMOS transistor.

8. The comparator circuit of claim 1, wherein the first reset unit comprises a first reset transistor, wherein the drain of the first reset transistor is connected to the output terminal of the first inverter, and the gate of the first reset transistor is connected to the inverted main clock signal.

9. The comparator circuit of claim 1, wherein the second reset unit comprises a second reset transistor, wherein the drain of the second reset transistor is connected to the output terminal of the second inverter, and the gate of the second reset transistor is connected to the inverted main clock signal.

10. The comparator circuit of claim 1, wherein the first pre-charging transistor and the second pre-charging transistor are PMOS transistors.

* * * * *